United States Patent [19]
Holland

[11] Patent Number: 5,963,497
[45] Date of Patent: Oct. 5, 1999

[54] DYNAMIC RANDOM ACCESS MEMORY SYSTEM WITH SIMULTANEOUS ACCESS AND REFRESH OPERATIONS AND METHODS FOR USING THE SAME

[75] Inventor: Wayland Bart Holland, Dallas, Tex.

[73] Assignee: Silicon Aquarius, Inc., Tex.

[21] Appl. No.: 09/080,813

[22] Filed: May 18, 1998

[51] Int. Cl.$^6$ ....................................................... G11C 7/00
[52] U.S. Cl. .................... 365/222; 365/149; 365/189.04; 365/203
[58] Field of Search .............................. 365/222, 189.04, 365/149, 203, 207

[56] References Cited

U.S. PATENT DOCUMENTS

| | | | |
|---|---|---|---|
| 5,007,022 | 4/1991 | Leigh .................................. | 365/189.04 |
| 5,010,519 | 4/1991 | Yoshimoto et al. .................... | 365/149 |
| 5,381,379 | 1/1995 | Fukumoto ........................... | 365/195 X |
| 5,636,174 | 6/1997 | Rao ..................................... | 365/207 X |

OTHER PUBLICATIONS

"Transparent–Refresh DRAM (TreD) Using Dual–Port DRAM Cell" by Sakurai, Nogami, Sawada and Iizuka, 1988 IEEE Custom Integrated Circuits Conference pp. 4.3.1 through 4.3.4.

*Primary Examiner*—Do Hyun Yoo
*Attorney, Agent, or Firm*—James J. Murphy, Esq.; Winstead Sechrest & Minick

[57] ABSTRACT

A memory 200 including an array 201 of rows and columns of 2-transistor, 1-capacitor memory cells 301 of the cells of each row coupled to first and second wordlines 303a, 303b and the cells of each column coupled to a pair of bitlines 302a, 302b. Refresh circuitry 208 activates the first wordline 303a plus selected said row and refreshes the cells 301 of that row through a first one of the bitlines 302a of each of the columns. Data access circuitry 202, 204 substantially simultaneously activates the second said wordline 303b of a second selected row and accesses selected cells of the second row through a second one of the bitlines 302b in the corresponding columns.

18 Claims, 3 Drawing Sheets

DYNAMIC RANDOM ACCESS MEMORY SYSTEM WITH SIMULTANEOUS ACCESS AND REFRESH OPERATIONS AND METHODS FOR USING THE SAME

TECHNICAL FIELD OF THE INVENTION

The present invention relates in general to electronic memories and in particular to a dynamic random access memory system with simultaneous access and refresh operations and methods using the same.

BACKGROUND OF THE INVENTION

Dynamic random access memory (DRAM) is the principal type of memory used in most applications such as personal computers (PCS). When compared, for example, to static random access memory (SRAM), DRAM is less expensive, consumes substantially less power, and provides more bits in the same chip space (i.e. has a higher cell density). DRAM is normally used to construct those memory subsystems, such as system memories and display frame buffers, where power conservation and high cell density are more critical than speed. In most computing systems, it is these subsystems which dominate the system architecture, thus making DRAM the prevalent type of memory device on the market.

Notwithstanding these significant advantages, DRAMs are also subject to significant restraints due to the manner in which they must be constructed and operated. Specifically, since each cell stores data as charge on a capacitor (i.e. charged to a predetermined voltage for a logic 1 and discharged to approximately 0 volts for a logic 0), the length of time a bit, and in particular a logic 1 bit, can be stored in a given cell is a function of the ability of the capacitor to retain charge. Charge retention, and consequently data integrity is in turn is a function of charge leakage.

For purposes of the present discussion, two particular charge leakage mechanisms will be considered. In the first mechanism, leakage from the capacitor storage plate to plate occurs because the high dielectric layers used to make small capacitors with sufficient capacitance are lossy. Second, charge on the storage plate of the cell leaks back through the pass transistor during the transistor off state ("subthreshold leakage"). In a robust DRAM design, each of these problems must be addressed.

Almost all DRAMs maintain data integrity through the periodic refresh of the memory cells to the voltage of the logic 1 data, which has deteriorated as charge has leaked off the capacitor, back to the full storage voltage. This is done by simply reading and restoring the data in cells in the cell array row by row. Depending on the refresh scheme, all the rows in the array or subarray may be refreshed by stepping though the rows in a single sequence or by distributing the refresh of smaller groups of rows of the array between read or write and write operations. In any event, refresh can seriously impact the performance of the DRAM. Among other things, refresh consumes memory cycles which would otherwise be available for reads and writes; every refresh of a row requires a new precharge/active cycle. With each cycle used for refresh, the array or subarray containing the row being precharged is unavailable for read and write accesses. The problem of refresh is only compounded as high density devices are contemplated, where the refresh period must be reduced in order to be able to refresh the entire array without reducing the time the system can access the memory.

Efforts have been made to minimize cell leakage such that the integrity of the data can be maintained for a longer period of time and hence the period between required refresh correspondingly increased. One way has been to bias the substrate in which the cells sit to reduce subthreshold leakage. Presently a triple-well process is used. Consider the case of n-channel pass transistors. In the triple-well process, the n-channel pass transistors in the DRAM cell (as well as the storage capacitors) array sit in an isolated p-type well which in turn sits in a n-type well. The n-type well has previously been formed in a p-type substrate. The p-type well in which the cells sit is then biased by a negative voltage $V_{BB}$, which is typically around −1 v, with respect to the grounded substrate. This effectively raises the threshold voltage of the cell pass transistors and cuts off subthreshold leakage. The separate p-well is used to isolate the array from the peripherals such that the biasing of the cell array does not degrade the performance of the peripheral circuits which have a grounded substrate. Without the isolated p-well, the substrate biasing would also raise the threshold of the transistors in the high performance peripherals and deteriorate their performance.

The triple well process along with the charge pumps which produce the bias voltage $V_{BB}$ are difficult and expensive to implement. The ability to eliminate them would provide substantial advantages over the prior art and represent a substantial leap in DRAM technology.

Additionally, the elimination of the isolated p-well, and correspondingly the intervening n-well, the fabrication process for the cell array becomes more compatible with that of the remaining circuitry on the chip, particularly the high performance circuitry in the periphery.

As DRAM cell densities increase, cell size, and correspondingly storage capacitor size, must shrink. Capacitor size is a function of the capacitor dielectric material chosen, the higher the dielectric constant of the material, the more capacitance can be achieved per unit area. While high dielectric materials allow for the fabrication of smaller capacitors, such materials, due to their physical nature, are leaky and must be refreshed at a higher rate. On the other hand, lower dielectric materials are less leaky but force the use of larger capacitor plates. As a consequence, trench, stacked and other complex capacitor structures have been developed to allow the use of lower dielectric constant, lower leakage materials, and which consequently increase in capacitor plate size, while still allowing the overall size of the cells to be small.

Thus, the need has arisen for circuits, system and methods which support efficient refresh of DRAM arrays. Such methods circuits, systems and methods should be sufficiently robust such that the triple-well process and the associated charge pumps can be eliminated. Further, the ability to use leaky, high dielectric materials in the construction of smaller memory cells should also be addressed.

SUMMARY OF THE INVENTION

According to one embodiment of the principles of the present invention, array of rows and columns of two transistor 1-capacitor memory cells, the cells of each of the rows being coupled to first and second wordlines and the cells of each of columns coupled to a pair of bitlines. Refresh circuitry is also disclosed for activating the first wordline of a selected rows refreshing the cells of that row through first one of said bitlines of each of the columns. Data access circuitry provided for substantially simultaneously activating the second wordline of a second one of the rows accessing selected cells of the second row through a second one of the bitlines corresponding columns. According to another embodiment of the principles of the present invention, memory is disclosed which includes a plurality of leaking memory cells arranged in rows and columns wherein row J comprises a pair of wordlines $WL_jA$ and $WL_jB$ and column I comprises a pair of bitlines $BL_iA$ and $Bl_iB$, wherein I and J are integers. A sense amplifier $S_iA$ is coupled to the bitline $BL_iA$ of column I and a sense amplifier $S_iB$ is coupled to bitline $BL_iB$ of column I. Access circuitry selectively accesses a cell on row J using wordline $WL_jB$, bitline $Bl_iB$ of sense amplifier $S_iB$. Refresh circuitry refreshes a row of cells j using wordline $WL_jA$, bitlines $BL_iA$ and sense amplifiers $S_iA$.

The principles of the present invention are also embodied in methods of operating a memory having an array of rows and columns of 2-transistor, 1-capacitor memory cells, the cells of each row coupled to first and second wordlines and the cells of each column coupled to first and second bitlines, each bitline being coupled to a sense amplifier. A cell in the array is accessed by selecting a first row in the array by activating the first wordline of the first row and then accessing a selected cell in the first row through the first bitline of the column containing the selected cell. Substantially simultaneously with the operation of accessing a selected cell, at least one second row in the array is refreshed. The second wordline of the at least one second cell in the array is activated and the data in the cells in the at least one second row is restored using the second bitlines and the sense amplifiers coupled to the second bitlines of the columns in the array.

The present inventive teachings provide for a substantial leap forward in DRAM technology. In particular, the refresh rate can be significantly increased over conventional DRAMs, allowing small memory cells using planar capacitors to be used. Since a higher degree of cell leakage is tolerable, the triple-well process, and associated charge pumps, currently used in the fabrication of DRAM devices can be eliminated. Moreover, the system overhead required for a refresh can be substantially reduced or eliminated.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–6 of the drawings, in which like numbers designate like parts.

Figure 1A:
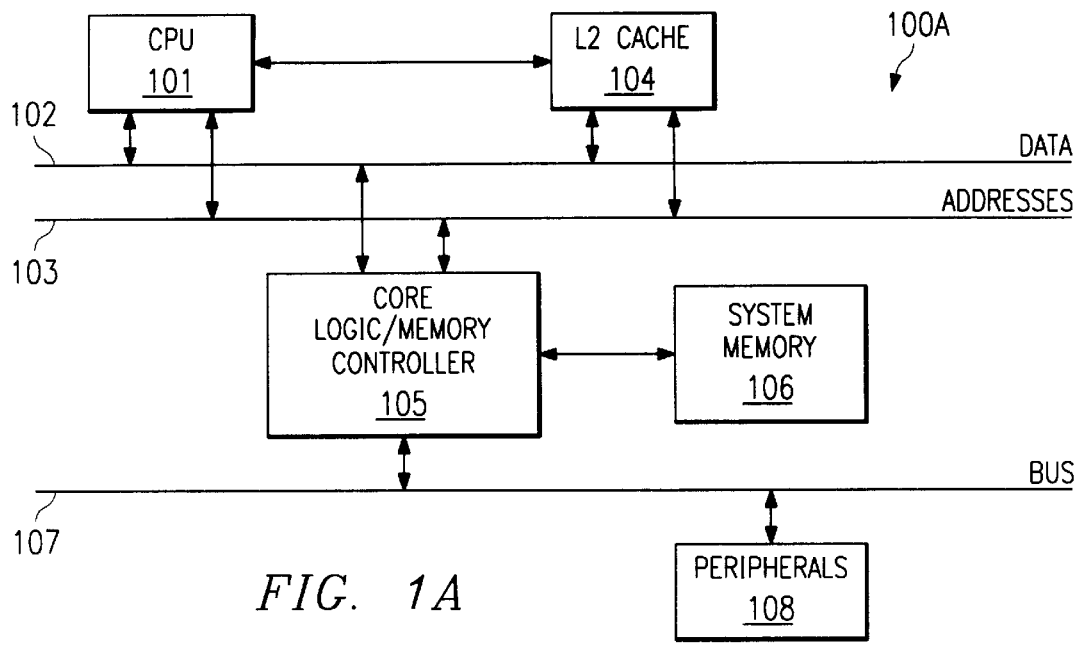
FIGS. 1A and 1B are block diagrams respectively depicting two basic system architectures typical of those found in personal computers.
Figure 1B:
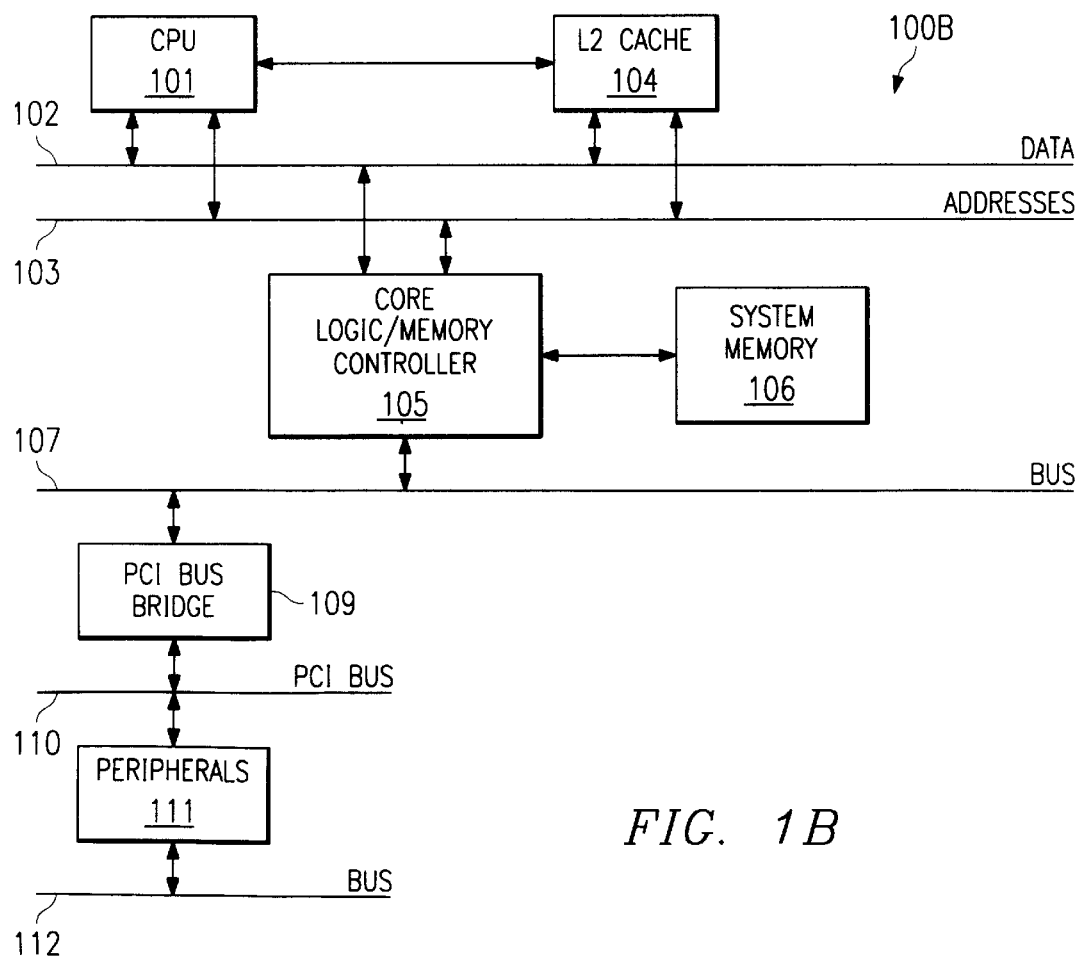

FIGS. 1A and 1B are block diagrams respectively depicting two basic system architectures 100A and 100B typical of those found in personal computers (PCS). While numerous variations on these basic architectures exist, FIGS. 1A and 1B are suitable for describing the basic structure and operation of most PCS. Both systems 100A and 100B include a single central processing unit 101, CPU local data bus 102, CPU local address bus 103, external (L2) cache 104, core logic/memory controller 105, and system memory 106. In system 100A, the peripherals 108 are coupled directly to core logic/memory controller 105 via a bus 107. Bus 107 in this case is preferably a peripheral controller interface (PCI) bus, although alternatively it could be an ISA, general, or special purpose bus, as known in the art. In system 100B, core logic/memory controller 105 is again coupled to bus 107. A PCI bus bridge then interfaces bus 107 with a PCI bus 110, to which the peripherals 111 couple. An additional bus 112, which may be a ISA, PCI, VESA, IDE, general, or special purpose bus, is provided for access to peripherals 111 from an external device or system (not shown).

In single CPU systems 100A and 100B, CPU 101 is the "master" which, in combination with the operating system and applications software, controls the overall operation of system 100. Among other things, CPU 101 performs various data processing functions including numerical and word processing, generates graphics data, and performs overall system management. CPU 101 may be for example a complex instruction set computer (CISC), such as an Intel Pentium™ class microprocessor, a reduced instruction set computer (RISC), such as a Apple PowerPC™ microprocessor, or a very long instruction word (VLIW) machine.

CPU 101 communicates with the remainder of system 100 via CPU local address and data buses 102 and 103, each of which may be for example a special bus, or a general bus, as known in the art.

Core logic/memory controller 105, under the direction of CPU 101, controls the exchange of data, addresses, control signals and instructions between CPU 101, system memory 105, and peripherals 108/111 via bus 107 and/or PCI bus bridge 109. Although the core logic/memory controller allows tasks to be shifted from the CPU, thereby allowing the CPU to attend to other CPU-intensive tasks, the CPU can always override core logic/memory controller 105 to initiate execution of a higher priority task.

Core logic and memory controllers are widely available in the PC industry and their selection and application are well known by those skilled in the art. The memory controller can be either a separate device or incorporated into the same chip set as the core logic. The memory controller is generally responsible for generating the memory clocks and control signals such as SCLK (System Clock) /RAS, /CAS, R/W and bank select, and monitors and controls cell refresh. The memory controller may also have some address generation capability for accessing sequences of pages.

The core logic is typically comprised of a chip-set, with one or more chips typically being "address and system controller intensive", and one or more chips typically being "data intensive." Among other things, the address intensive chip(s): interfaces CPU 101 with address bus 103; maintains cache coherency, including the cache tags, set associative cache tags and other data necessary to insure cache coherency; performs cache "bus snooping"; generates the control signals required for DRAMs in the system memory or cache; and controls general management transactions. The data intensive chip(s) generally: interfaces CPU 101 with the data bus 102; issues cycle completion responses; may abort operations if their cycles are incomplete; and arbitrates for the data path of bus 102.

CPU 101 can directly communicate with core logic/memory controller 103 or through an external (L2) cache 104. L2 cache 104 may be for example a 256 KByte fast SRAM device(s). Typically, the CPU also maintains up to 16 kilobytes of on-chip (L1) cache.

PCI bus bridges, such as PCI bus bridge 109, are also well known to those skilled in the art. In the typical PC, the CPU is the bus master for the entire system and hence devices such as PCI bus bridge are slave devices which operate under command of the CPU.

Peripherals 107/111 may include a display controller and associated frame buffer, floppy drive controller, disk driver controller, and/or modem, to name only a few options.

Figure 2:
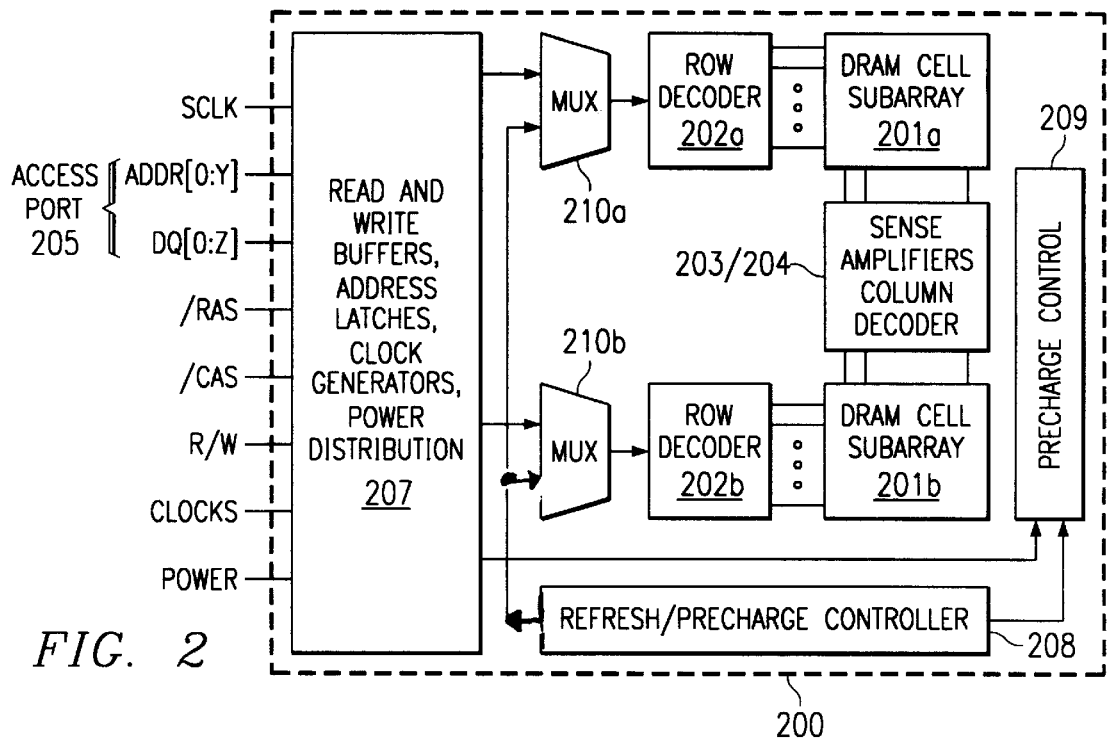
FIG. 2 illustrates a high level functional block diagram of a DRAM memory embodying the principles of the present invention.

FIG. 2 is a high level functional block diagram of a DRAM memory 200 embodying the teachings of the present invention. Memory 200 is suitable for such applications as system memory 106 in either of the exemplary processing environments shown in FIGS. 1A and 1B. Many other applications of memory 200 are possible.

Memory 200 includes an array 201 organized as a pair of subarrays 201a and 201b (collectively array 201), each composed of rows and columns of DRAM cells. Each row of cells is associated with at least two conductive wordlines and each column of cells is associated with at least two conductive bitlines. This unique double bitline/double wordline approach will be discussed in detail below.

Generally, during an access, a row of cells in array 201 is selected in response to a received row address by one of the row decoders 202a or 202b. The given decoder activates one of the pair of conductive wordlines associated with that row. Data is input to or output from, each selected cell along the row through one of the pair of bitlines associated with the corresponding column and the column decoder 204 in response to a received column address.

During a read, the data from the entire active row of cells are sensed and latched by sense amplifiers 203. For discussion purposes, it will be assumed that the bitlines are coupled to sense amplifiers 203 in an open-bitline fashion, with complementary bitlines disposed in subarrays 201a and 201b respectively. Preferably, each bitline of each pair of bitlines of a give column is associated with a dedicated sense amplifier within sense amplifier block 203. Column decoder 204, in response to a received column address(es), selectively passes the desired data (e.g. in bits, bytes or words) from the sense amplifiers 203 corresponding to the appropriate locations along the active row to the read buffers (block 207). During a write, data are transferred to the locations addressed by the column address along the active row by the write buffers (block 207) directly through column decoder 204 (the data in sense amplifiers 203 are essentially written over).

In the illustrated embodiment, the data passed by column decoder 204 are selectively input to or output from device 200 through Z number of access data input/output lines (DQ[0:Z]) in response to row and column addresses received at Y number of corresponding multiplexed access address lines (ADD[0:Y]). Collectively, the access data lines and the access address lines comprise access port 205.

Row addresses are latched into address latches within block 207 through the multiplexed address lines on the falling edge of external /RAS. At least one column address is similarly latched through the access address lines on the falling edge of external /CAS. (For page and burst mode accesses, column addresses can be generated externally and input with external /CAS or can be generated internally). External /RAS is also used to time the precharging of only one of the two bitlines associated with each column of cells (as discussed below, the other bitline in each column is used for refresh and has a precharge timing based on an internal /RAS signal or clock).

Block 207 generally includes the traditional input/output circuitry, including read and write buffers, address latches, power distribution circuitry and clock generation circuitry. If DRAM 200 is a synchronous DRAM, it will include the synchronous DRAM master clock (SCLK) which controls the overall timing.

DRAM 200 further includes internal a refresh/precharge controller 208, precharge circuitry 209 and multiplexers 210. Collectively, this circuitry allows for the data in selected rows of cells in the array to be refreshed simultaneously with data accesses to other selected rows in the array. Further, since entire rows are read and restored during refresh (i.e. there is no paging or bursting during refresh) the /RAS active period can be relatively short. Hence, the internal /RAS controlling precharge of the refresh bitlines can run not only asynchronously with respect to the external /RAS, but also at a much higher frequency.

Figure 3:
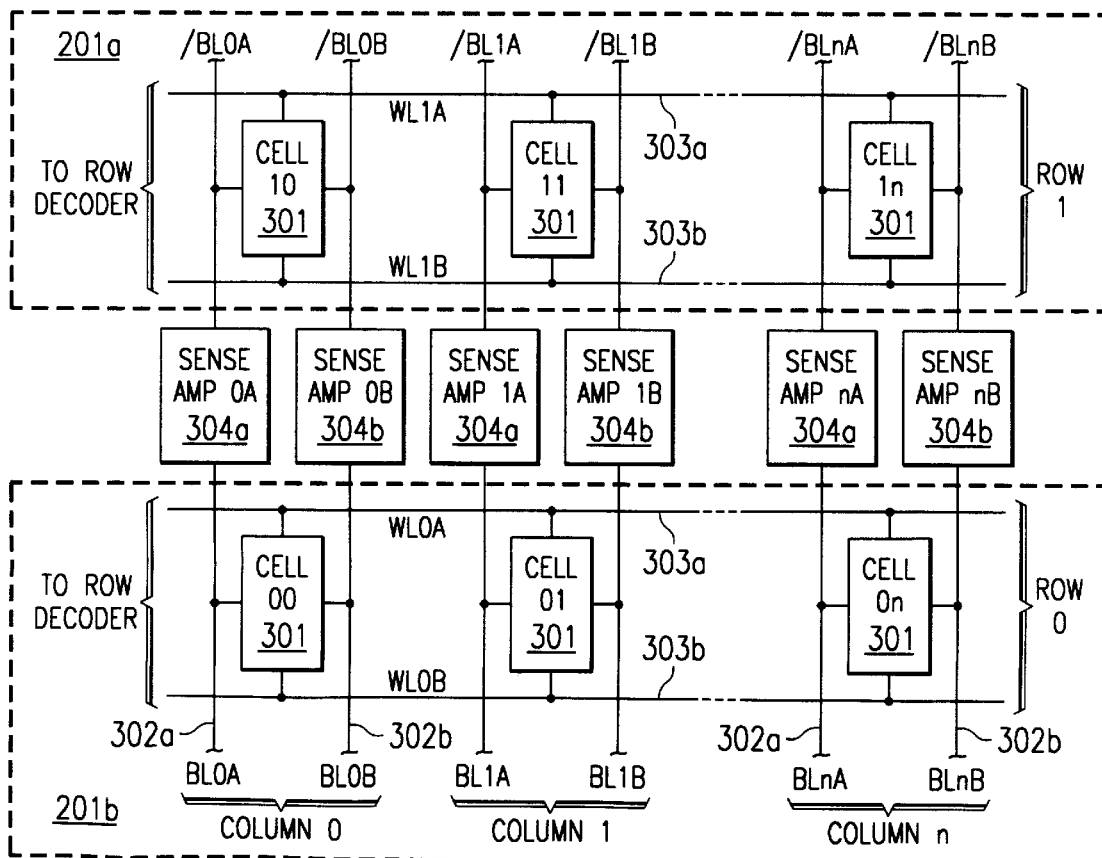
FIG. 3 is a diagram of a highly enlarged small portion of the memory array shown in FIG. 2.

FIG. 3 depicts a portion of subarrays 201a and 201b and the corresponding sense amplifiers. Specifically, FIG. 3 shows three exemplary physical columns (Columns 0, 1 and n) and two exemplary rows (Rows 0 and 1) of an m row by n column array, with half of the rows disposed in each of subarrays 201a and 201b. In actual implementation the number of rows and columns will be much larger, the array could be, for example, 1024 rows by 1024 columns (i.e. m=n=1024) or larger.

In the illustrated embodiment of FIG. 3, an open bitline arrangement is employed, although a folded bitline approach could also be selected. Each cell 301 in each subarray 201 is coupled to a pair of bitlines 302a and 302b (labeled $BL_iA$ and $BL_iB$, where i is the column number between 0 and n) and a pair of wordlines 303a and 303b (labeled $WL_jA$ and $WL_jB$, where j is the row number between 0 and m). Each bitline 302a/302b of each column is coupled to a corresponding dedicated sense amplifier 304a or 304b, with the corresponding bitlines of subarrays 201a and 201b coupled to the same sense amplifier 304 being complementary. For illustration, the even numbered pairs of wordlines 303 are shown in subarray 201b and the odd numbered pairs shown in subarray 201a.

Figure 4:
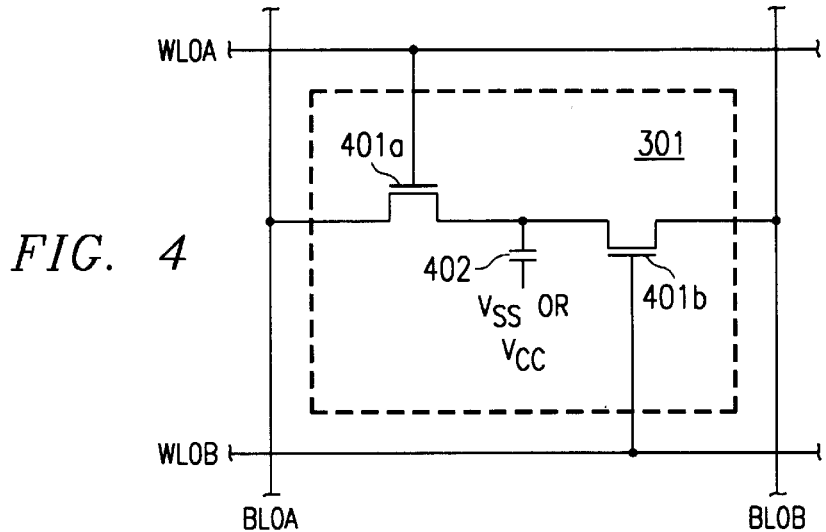
FIG. 4 is a diagram of a highly enlarged memory cell of FIG. 3.

Cells 301 are preferably constructed as the 2-transistor, 1-capacitor (2T-1C) cell depicted in FIG. 4. For discussion purposes, the cell at the intersection of wordlines $WL_0A$ and $WL_0B$ and bitlines $BL_0A$ and $BL_0B$ is shown for reference. Each cell includes a first pass transistor 401a for coupling a first plate of data storage capacitor 402 with bitline $BL_0A$ in response to active (high) voltage impressed on $WL_0A$. A second pass transistor 401b similarly selectively couples the storage capacitor 402 to bitline $BL_0B$ when an active (high) voltage is presented on wordline $WL_0B$. Both Pass transistors, sharing the same "rstorage capacitor" cannot be simultaneously turned "on". For a complete description of cells 301 and their advantages, reference is now made to copending and coassigned patent applications Ser. No. 08/911,737, filed Aug. 15, 1997, now U.S. Pat. No. 5,856,940 and entitled "LOW LATENCY DRAM CELL AND METHOD THEREFOR" and 09/016,559, filed Jan. 30, 1998 and entitled "LOW LATENCY MEMORIES AND SYSTEMS USING THE SAME" (Attorney's Docket No. 17200-P014US), both incorporated herein by reference.

According to the principles of the present invention, selected rows in array 201 can be accessed while other selected rows are simultaneously refreshed. Generally, simultaneous access and refresh operations can be accomplished by using one bitline of each column and one wordline of each row for data accesses through access port 205 and the other bitline of each column and the other wordline of each row for refresh under control of internal refresh/precharge controller 208. Although other configurations are possible, for ease of discussion, assume that addresses internally generated for refresh by refresh controller 208 are decoded to exclusively access wordlines $WL_jA$, with refresh effectuated by bitlines $BL_iA$ and the corresponding sense amplifiers 304a. Consequently, addresses received at access port 205 are decoded to exclusively access wordlines and bitlines $WL_jB$ and $BL_iB$ through sense amplifiers 304b.

Figure 5:
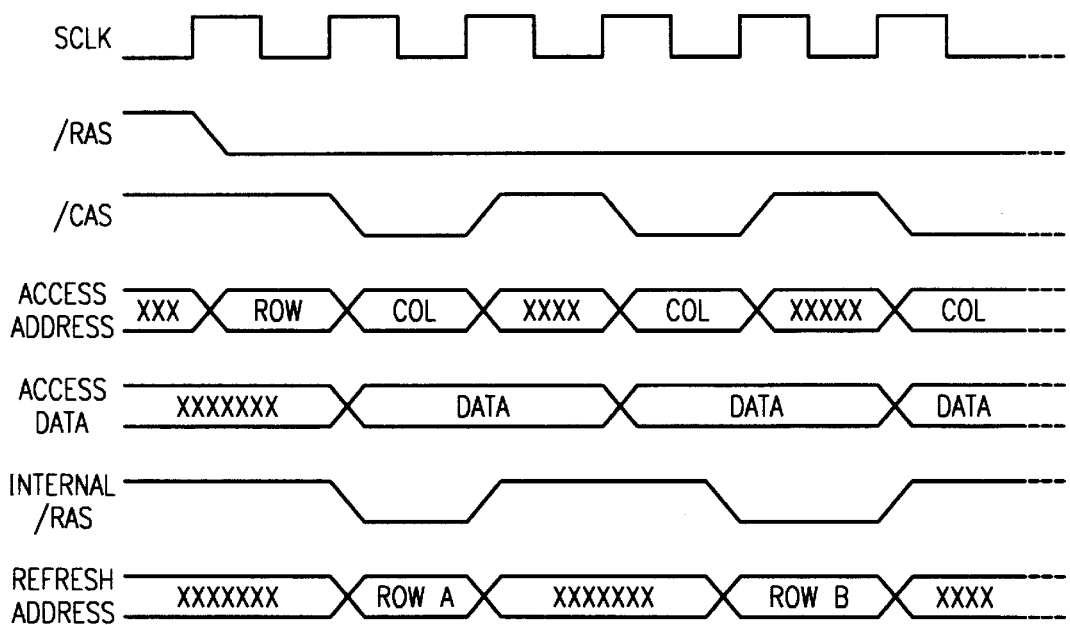
FIG. 5 is a timing diagram of a representative operating sequence of the memory of FIG. 2

The operation of memory 200 can now be described with reference to FIG. 5 which is a simplified conceptual timing diagram. It should be noted that while a traditional operating scheme using /RAS and /CAS is shown, these strobes are not required in every embodiment of the present teachings. For example, in synchronous embodiments, all timing can be based solely on the system clock (SCLK.)

On the falling edge of /RAS, a row address is latched in to select wordline $WL_jB$ associated with the row to which the desired data access is being performed. The selected row can be any row in array 201. For discussion purposes assume that the Row 1 has been selected for access. Shortly after /RAS transitions low, wordline $WL_1B$ transitions high, the pass transistor 401a of each cell 301 of Row 1 turns-on and the capacitors 402 for that row are available for access through bitlines $BL_iB$.

For a read, the data from the entire selected row of cells 301 are sensed and latched by sense amplifiers 304b. In the case where Row 1 has been selected, bitlines $BL_iB$ of subarray 201a carry data to the sense amplifiers and bitlines $BL_iB$ of subarray 201b are used as the complementary bitlines for sensing purposes. During a write, the data in sense amplifiers 304b are overwritten as new data is driven from the write buffer 207.

On each falling edge of /CAS, a column address is latched-in through the address lines of access port 205 and words of data are transferred to or from the sense amplifiers 304b of the addressed columns via the data lines of access port DQ0 (/CAS can also be generated on-chip). The width of each word of data is a design choice; for example, in a by 16 device 16 bits are accessed per column address (/CAS cycle). The number of words paged in or out during the time when /RAS is low can vary from one up to the maximum number of words per row, depending on the application.

In this example, refresh is performed by refresh/precharge controller 208 independent of any data accesses made through access port 205. As shown in FIG. 5, an internal /RAS signal or similar clock controls the refresh timing asynchronous to the externally generated signals controlling the data accesses. For discussion purposes, it will be assumed that the refresh operations are being timed by an internal /RAS signal.

During each period in which the internal /RAS is high, refresh/precharge controller 208 and precharge circuitry 209 precharge bitlines $BL_iA$ of array 201. Then, on the falling edge of internal /RAS, the active refresh period begins. Refresh/precharge controller 208 generates a refresh row address to any row in array 201. Specifically, this refresh row address selects the wordline $WL_jA$ of the row to be refreshed; assume for example wordline $WL_0A$ of Row 0.

The row address is decoded, wordline $WL_0A$ is activated and pass transistors 401a of each of the cells row cells along Row 0 turn-on. The data stored in Row 0 are then read and restored by sense amplifiers 304a through bitlines $BL_0A$. Bitlines $BL_0A$ are then returned to precharge. These row refresh cycles can be continuously performed essentially independently from the data access being performed through the access port and the external /RAS timing.

Controller 208 can refresh bitlines using any one of a number of schemes. For example, it can simply sequentially generate row addresses using a counter and refresh the rows in the entire array 201 in sequence beginning from Row 0. Alternatively, refresh can be done on a subarray by subarray basis, a distributed block by block basis, or even a distributed row by row basis.

The primary advantage of the present teachings is that since one or more rows can be refreshed while another row is accessed, embodying devices can operate significantly faster. In particular, the refresh rate can be significantly increased over conventional DRAM devices. Increased refresh rate in turn allows for a higher tolerable leakage rate for the devices in the DRAM cell array. Thus, the higher dielectric constant materials necessary to make smaller planar storage capacitors 402, and hence smaller cells 301, can be fabricated without the need for stacked or trench capacitor technologies. Further, since higher cell leakage is tolerable, the triple-well process and the accompanying charge pumps can be eliminated.

An exemplary cell according to the present teachings may for example have the following leakage characteristics, defined in terms of tREF, which is the refresh time between $tREF_{max}$ and $tREF_{min}$:

$tREF_{max}$=3.8 microseconds×number of rows in array 201;
and
$tREF_{min}$=tRESTORE×number of rows in array 201.
where:
3.8 microseconds is the maximum period for refreshing a row (i.e. refresh overheads);
$tREF_{max}$ is the maximum time between refresh cycles for a given row of cells;
$tREF_{min}$ is the minimum time between refresh cycles for a given row of cells; and
tRESTORE is the time from a row address change until the sense/restore function of the addressed row is complete in the minimum amount of time achievable in the fabrication and design technology applied.

These specifications are in sharp contrast to the prior art where the maximum refresh rate of the system is 3.0 microseconds. In other words, using conventional DRAMs, a system takes a time-out to refresh a row of cells only after at least 3.0 microseconds of data accesses. With the present invention, the refresh overhead can be reduced to zero and 100 percent of the time accesses can be made to the array.

Figure 6:
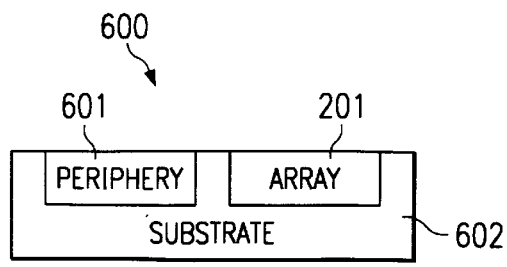
FIG. 6 is a highly enlarged portion of a semiconductor chip embodying the circuitry of the present invention.

FIG. 6 is a highly enlarged portion of a semiconductor chip 600 embodying the circuitry of the present invention. Specifically, both array 201 and peripheral circuitry 601 can now be formed in the same substrate 602 (without the need for the isolated p-well for array 201). For example, all n-channel transistors in periperhy 601 and array 201 are now formed in a p-substrate 602.

In addition to the cost savings associated with manufacturing DRAMs on a grounded substrate (i.e., without the triple-well process), another key advantage is increased performance of the memory device. As integrated circuit technology scales to smaller feature sizes, it is necessary to reduce the operating voltage of the transistors. In the conventional DRAM technology the substrate which is normally biased at a negative voltage with respect to ground inhibits the ability to scale the operating voltage of the sense amplifier, as well as other core circuits, without sacrificing signal noise margins and sensing speed performance. This is due to the higher effective threshold voltages caused by the substrate bias. With a grounded substrate, some processes (e.g. ASIC logic) have even allowed the operating voltages to drop below one volt. Even in non-portable applications, this lower voltage results in large power savings for the overall system. A DRAM fabricated on this process can take advantage of these benefits without sacrificing speed and reliability.

Although the invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It is therefore contemplated that the claims will cover any such modifications or embodiment that fall within the true scope of the invention.

What is claimed is:

1. A memory comprising:
   an array of rows and columns of two-transistor, one-capacitor memory cells, said cells of each said row coupled to first and second wordlines and said cells of each said column coupled to a pair of bitlines;
   refresh circuitry for refreshing selected ones of the rows in said array in response to an active period of a first control signal and activating said first wordline of a first selected said row and refreshing said cells of said first row through a first one of said bitlines of each of said columns; and
   data access circuitry for substantially simultaneously activating said second wordline of a second selected said row and accessing selected said cells of said second row through a second one of said bitlines of corresponding said columns in response to an active period of a second control signal, said first control signal delayed with respect to said second control signal such that said second wordline is activated prior to activation of said first wordline.

2. The dynamic memory of claim 1 wherein said refresh circuitry comprises an internal refresh controller operable to refresh selected ones of said rows in said array at a rate substantially different from a rate said date access circuitry accesses selected ones of said rows.

3. The dynamic memory of claim 1 wherein said data access circuitry comprises a dedicated access port for inputting and outputting data a nd inputting addresses.

4. The dynamic memory of claim 1 wherein each said memory cell comprises:
   a storage capacitor;
   a first transistor for selectively coupling said storage capacitor with said first bitline of a corresponding said column in response to activation of said first wordline of a corresponding said row; and
   a second transistor for selectively coupling said storage capacitor with said second bitline of a corresponding said column in response to activation of said second wordline of a corresponding said row.

5. The dynamic memory of claim 4 wherein said storage capacitor comprises a leaky dielectric.

6. The dynamic memory of claim 5 wherein said dielectric has a high dielectric constant.

7. A dynamic memory comprising:
   a plurality of leaky memory cells arranged in rows and columns wherein row j comprises a pair of wordlines $WL_jA$ and $WL_jB$ and column i comprises a pair of bitlines $BL_iA$ and $BL_iB$, wherein i, j are integers;
   a sense amplifier $S_iA$ coupled to bitline $BL_iA$ of column i and a sense amplifier $S_iB$ coupled to bitline $BL_iB$ of column i;
   access circuitry for selectively accessing a memory cell on row j using wordline $WL_jB$, bitline $BL_iB$ and sense amplifier $S_iB$; and
   refresh circuitry for refreshing a row of cells using wordline $WL_iA$, bitlines $BL_iA$ and sense amplifiers $S_iA$, the refresh circuitry activating wordline $WL_iA$, after data from the accessed memory cell has been latched by sense amplifier $S_iB$.

8. The dynamic memory of claim 7 wherein each of said cells comprises a 2-transistor, 1-capacitor dynamic random access memory cell.

9. The dynamic memory of claim 7 wherein each said memory cell comprises:
   a storage capacitor fabricated using a leaky dielectric;
   a first transistor for selectively coupling said capacitor and bitline $BL_iA$ of column i in response to activation of wordline $WL_jA$ of row j; and
   a second transistor for selectively coupling said capacitor and bitline $BL_iB$ of column i in response to activation of wordline $WL_jB$ of row j.

10. The dynamic memory of claim 9 wherein said memory cells are formed unisolated in a semiconductor substrate.

11. The dynamic memory of claim 10 and further comprising peripheral circuitry formed unisolated in said substrate.

12. The dynamic memory of claim 7 wherein said access circuitry and said refresh circuitry operate in response to different timing signals.

13. The dynamic memory of claim 12 wherein said access circuitry accesses data in response to an externally generated timing signal and said refresh circuitry operates in response to an internally generated timing signal.

14. A method of operating a memory having an array of rows and columns of two-transistor, one-capacitor memory cells, the cells of each row coupled to first and second wordlines and the cells of each column coupled to first and second bitlines, each bitline coupled to a sense amplifier, the method comprising the steps of:
   accessing a selected cell in said array comprising the substeps of:
   selecting a first row in the array containing the selected cell by activating the first wordline of the first row; and
   accessing the selected cell in the first row through the first bitline of the column containing the selected cell and the sense amplifier coupled to the first bitline of the column; and
   substantially simultaneously with said step of accessing refreshing at least one second row in the array, said step of refreshing comprising the substeps of:
   activating the second wordline of the at least one second row in the array after data accessed from the selected cell has been latched in said sense amplifer coupled to the first bitline; and
   restoring the data in the cells in the at least one second row using the second bitlines and the sense amplifiers coupled to the second bitlines of the columns in the array.

15. The method of operating of claim 14 wherein said step of accessing is timed by a first timing signal and said step of refreshing is timed by a second timing signal, the second timing signal having a frequency greater than a frequency of the first timing signal.

16. The method of operating of claim 15 wherein said step of refreshing comprises the substeps of refreshing a plurality of rows substantially simultaneously with said step of accessing.

17. The method of operating of claim 16 wherein said substeps of refreshing comprise:

precharging the first bitlines prior to said step of accessing; and precharging the second bitlines prior to refreshing each of said plurality of rows.

18. The method of operating of claim 17 wherein said substep of precharging the first bitlines is timed by a first timing signal and said substep of precharging said second bitlines is timed by a second timing signal, a frequency of said second timing signal being greater than a frequency of said first timing signal.

* * * * *